US010234626B2

(12) United States Patent
Lambert (10) Patent No.: US 10,234,626 B2
(45) Date of Patent: Mar. 19, 2019

(54) STEPPED OPTICAL BRIDGE FOR CONNECTING SEMICONDUCTOR WAVEGUIDES

(71) Applicant: Skorpios Technologies, Inc., Albuquerque, NM (US)

(72) Inventor: Damien Lambert, Los Altos, CA (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

(21) Appl. No.: 15/426,366

(22) Filed: Feb. 7, 2017

(65) Prior Publication Data

US 2017/0227709 A1 Aug. 10, 2017

Related U.S. Application Data

(60) Provisional application No. 62/292,636, filed on Feb. 8, 2016, provisional application No. 62/292,675, filed
(Continued)

(51) Int. Cl.
*G02B 6/12* (2006.01)
*G02B 6/122* (2006.01)
(Continued)

(52) U.S. Cl.
CPC ......... *G02B 6/12002* (2013.01); *G02B 6/122* (2013.01); *G02B 6/12004* (2013.01);
(Continued)

(58) Field of Classification Search
CPC ...... G02B 6/12002; G02B 2006/12061; H01S 5/0202; H04B 10/505; H04J 14/02
See application file for complete search history.

(56) References Cited

U.S. PATENT DOCUMENTS 3,894,789 A * 7/1975 Kobayashi ........... G02B 6/4203
                                                    359/652
5,780,875 A * 7/1998 Tsuji .................... G02B 6/4224
                                                    257/81
(Continued)

FOREIGN PATENT DOCUMENTS

WO      2014-083507 A2    6/2014
WO      2015-054491 A1    4/2015

OTHER PUBLICATIONS

International Search Report and Written Opinion dated Apr. 25, 2017 for International Patent Application No. PCT/US2017/016968; all pages.
(Continued)

*Primary Examiner* — Peter Radkowski
(74) *Attorney, Agent, or Firm* — Kilpatrick Townsend & Stockton LLP (57) ABSTRACT

A photonic device includes a semiconductor wafer having a waveguide formed therein. An end of the waveguide includes a step. The photonic device further includes a semiconductor chip bonded to the semiconductor wafer and having an active region, and a waveguide coupler disposed in a gap between a sidewall of the semiconductor chip and the end of the waveguide. The waveguide coupler includes an optical bridge that has a first end and a second end opposing the first end. The first end of the optical bridge is interfaced with a facet of the active region of the semiconductor chip. The second end of the optical bridge is interfaced with the end of waveguide, and has a portion thereof disposed over the step at the end of the waveguide.

20 Claims, 11 Drawing Sheets

Related U.S. Application Data on Feb. 8, 2016, provisional application No. 62/292,633, filed on Feb. 8, 2016.

(51) Int. Cl.

| | | |
|---|---|---|
| *G02B 6/136* | (2006.01) | |
| *H01S 5/02* | (2006.01) | |
| *H01S 5/026* | (2006.01) | |
| *H01S 5/028* | (2006.01) | |
| *H01S 5/22* | (2006.01) | |
| *H01S 5/30* | (2006.01) | |
| *H01S 5/343* | (2006.01) | |
| *H01S 5/40* | (2006.01) | |
| *H04B 10/50* | (2013.01) | |
| *H04J 14/02* | (2006.01) | |
| *H01S 5/022* | (2006.01) | |

(52) U.S. Cl.
CPC ......... *G02B 6/12007* (2013.01); *G02B 6/136* (2013.01); *H01S 5/021* (2013.01); *H01S 5/0202* (2013.01); *H01S 5/026* (2013.01); *H01S 5/028* (2013.01); *H01S 5/02252* (2013.01); *H01S 5/22* (2013.01); *H01S 5/3013* (2013.01); *H01S 5/343* (2013.01); *H01S 5/4025* (2013.01); *H01S 5/4087* (2013.01); *H04B 10/505* (2013.01); *H04J 14/02* (2013.01); *G02B 2006/12061* (2013.01); *G02B 2006/12104* (2013.01); *G02B 2006/12121* (2013.01); *G02B 2006/12142* (2013.01); *G02B 2006/12147* (2013.01)

(56) References Cited

U.S. PATENT DOCUMENTS

| | | | | |
|---|---|---|---|---|
| 6,393,171 B2 * | 5/2002 | Sasaki | G02B 6/42 | 385/14 |
| 6,888,984 B2 * | 5/2005 | Abeles | G02B 3/0087 | 257/E33.068 |
| 7,359,593 B2 * | 4/2008 | Little | G02B 6/1228 | 385/28 |
| 7,470,069 B1 * | 12/2008 | Offrein | G02B 6/43 | 257/184 |
| 7,805,037 B1 * | 9/2010 | Van Der Vliet | G02B 6/12007 | 385/129 |
| 8,463,088 B1 * | 6/2013 | Asghari | B82Y 20/00 | 359/333 |
| 8,755,650 B2 * | 6/2014 | Peng | G11B 5/3133 | 385/124 |
| 9,048,958 B2 * | 6/2015 | Chaahoub | H04B 10/801 | |
| 9,097,846 B2 * | 8/2015 | Mizrahi | G02B 6/122 | |
| 2003/0044118 A1 * | 3/2003 | Zhou | G02B 6/1228 | 385/43 |
| 2003/0165293 A1 * | 9/2003 | Abeles | G02B 3/0087 | 385/33 |
| 2005/0117844 A1 * | 6/2005 | Abeles | B82Y 20/00 | 385/39 |
| 2005/0123244 A1 * | 6/2005 | Block | G02B 6/1221 | 385/43 |
| 2005/0202554 A1 * | 9/2005 | Luo | G02B 6/1228 | 435/287.2 |
| 2006/0104322 A1 * | 5/2006 | Park | G02B 5/26 | 372/34 |
| 2006/0115215 A1 * | 6/2006 | Liu | B82Y 20/00 | 385/43 |
| 2006/0210215 A1 * | 9/2006 | Aoki | H04B 10/40 | 385/14 |
| 2006/0285797 A1 * | 12/2006 | Little | G02B 6/1228 | 385/43 |
| 2007/0116410 A1 * | 5/2007 | Kwakernaak | G02B 6/12007 | 385/39 |
| 2007/0147761 A1 * | 6/2007 | Kwakernaak | G02B 6/12002 | 385/131 |
| 2007/0242919 A1 | 10/2007 | Welch | | |
| 2008/0180340 A1 * | 7/2008 | Hobbs | G02B 6/107 | 343/785 |
| 2010/0040327 A1 * | 2/2010 | Deki | G02B 6/1228 | 385/28 |
| 2010/0284019 A1 * | 11/2010 | Fukuda | B82Y 20/00 | 356/477 |
| 2010/0284698 A1 * | 11/2010 | McColloch | G02B 6/4201 | 398/135 |
| 2010/0303469 A1 * | 12/2010 | Barton | H04B 10/505 | 398/184 |
| 2011/0205660 A1 * | 8/2011 | Komura | B82Y 20/00 | 360/59 |
| 2011/0280579 A1 * | 11/2011 | McLaren | G02B 6/12007 | 398/79 |
| 2013/0051727 A1 * | 2/2013 | Mizrahi | G02B 6/122 | 385/28 |
| 2013/0064514 A1 * | 3/2013 | Peng | G11B 5/3133 | 385/124 |
| 2013/0230272 A1 * | 9/2013 | Raj | G02B 6/428 | 385/14 |
| 2014/0029951 A1 | 1/2014 | Handelman | | |
| 2014/0177222 A1 * | 6/2014 | Barwicz | F21V 21/00 | 362/249.01 |
| 2014/0342479 A1 * | 11/2014 | Marchena | H01L 21/76251 | 438/26 |
| 2015/0097210 A1 * | 4/2015 | Krasulick | H01L 31/02327 | 257/184 |
| 2015/0098676 A1 * | 4/2015 | Krasulick | G02B 6/1225 | 385/14 |
| 2015/0123157 A1 * | 5/2015 | Dallesasse | H01L 21/8258 | 257/98 |
| 2015/0177458 A1 * | 6/2015 | Bowers | G02B 6/12002 | 385/14 |
| 2015/0249501 A1 | 9/2015 | Nagarajan | | |
| 2015/0255952 A1 * | 9/2015 | Chaouch | G02B 6/125 | 372/20 |
| 2015/0260913 A1 * | 9/2015 | Li | G02B 6/12004 | 385/14 |
| 2015/0341123 A1 * | 11/2015 | Nagarajan | H04B 10/70 | 398/43 |
| 2016/0301191 A1 | 10/2016 | Orcutt | | |

OTHER PUBLICATIONS

International Search Report and Written Opinion dated Apr. 25, 2017 for International Patent Application No. PCT/US2017/016958; all pages.

Cherchi, et al.; "Dramatic size reduction of waveguide bends on a micron-scale silicon photonic platform"; *Optics Express*, Jul. 29, 2013; vol. 21, No. 15; DOI:10.1364/OE.21.017814; all pages.

Li, et al.; "High-Speed Optical Transmitter with a Silicon Substrate"; U.S. Appl. No. 15/426,823, filed Feb. 7, 2017.

Lambert; "Broadband Back Mirror for a III-V Chip in Silicon Photonics"; U.S. Appl. No. 15/426,375, filed Feb. 7, 2017.

U.S. Appl. No. 15/426,823 received a Non-Final Office Action dated May 17, 2018, 16 pages.

PCT/US2017/016968 received an International Report on Patentability dated Aug. 23, 2018, 8 pages.

* cited by examiner

STEPPED OPTICAL BRIDGE FOR CONNECTING SEMICONDUCTOR WAVEGUIDES

CROSS-REFERENCES TO RELATED APPLICATIONS

This application claims priority to U.S. Provisional Application No. 62/292,633, filed on Feb. 8, 2016, entitled "High-Speed Optical Transmitter with a Silicon Substrate," U.S. Provisional Application No. 62/292,675, filed on Feb. 8, 2016, entitled "Stepped Optical Bridge for Connecting Semiconductor Waveguides," and U.S. Provisional Application No. 62/292,636, filed on Feb. 8, 2016, entitled "Broadband Back Mirror for a III-V Chip in Silicon Photonics," the disclosures of which are incorporated by reference for all purposes.

The following three U.S. patent applications (including this one) are being filed concurrently, and the entire disclosure of the other applications are incorporated by reference into this application for all purposes:

Application Ser. No. 15/426,823, filed Feb. 7, 2017, entitled "High-Speed Optical Transmitter with a Silicon Substrate";

Application Ser. No. 15/426,366, filed Feb. 7, 2017, entitled "Stepped Optical Bridge for Connecting Semiconductor Waveguides"; and Application Ser. No. 15/426,375, filed Feb. 7, 2017, entitled "Broadband Back Mirror for a III-V Chip in Silicon Photonics".

BACKGROUND OF THE INVENTION

Silicon integrated circuits ("ICs") have dominated the development of electronics and many technologies based upon silicon processing have been developed over the years. Their continued refinement led to nano-scale feature sizes that can be important for making metal oxide semiconductor CMOS circuits. On the other hand, silicon is not a direct-bandgap material. Although direct-bandgap materials, including III-V semiconductor materials, have been developed, there is a need in the art for improved methods and systems related to photonic ICs utilizing silicon substrates.

SUMMARY OF THE INVENTION

According to an embodiment of the present invention, a photonic device includes a semiconductor wafer. The semiconductor wafer includes a base layer, a first insulating layer disposed over a surface of the base layer, a device layer disposed over the first insulating layer, and a waveguide formed in the device layer. The semiconductor wafer has a recess in the device layer and the first insulating layer. The recess exposes a portion of the surface of the base layer and forms a sidewall exposing an end of the waveguide. The end of the waveguide includes a step having a first length and a first height. The first height is less than a thickness of the waveguide. The photonic device further includes a semiconductor chip bonded to the surface of the base layer of the semiconductor wafer. The semiconductor chip includes an active region. A facet of the active region is exposed at a sidewall of the semiconductor chip. There is a gap between the sidewall of the semiconductor chip and the sidewall of the recess. The photonic device further includes a waveguide coupler disposed in the gap. The waveguide coupler includes a second insulating layer disposed over the surface of the base layer of the semiconductor wafer, and an optical bridge disposed over the second insulating layer. The optical bridge has a first end and a second end opposing the first end. The first end of the optical bridge is interfaced with the facet of the active region. The second end of the optical bridge is interfaced with the end of waveguide, and has a portion thereof disposed over the step at the end of the waveguide.

According to another embodiment of the present invention, a method for fabricating a photonic device includes providing a semiconductor wafer. The semiconductor wafer includes a base layer, a first insulating layer disposed over a surface of the base layer, a device layer disposed over the first insulating layer, and a waveguide formed in the device layer. The method further includes performing etching to form a recess in the device layer and the first insulating layer. The recess exposes a portion of the surface of the base layer, and has a sidewall exposing an end of the waveguide. The method further includes bonding a semiconductor chip to the exposed portion of the surface of the base layer. The semiconductor chip includes an active region. A facet of the active region is exposed at a sidewall of the semiconductor chip. There is a gap between the sidewall of the semiconductor chip and the sidewall of the recess. The method further includes forming a second insulating layer in the gap, performing etching to remove a portion of the waveguide to form a step at the end of the waveguide, and forming an optical bridge over the second insulating layer. The optical bridge has a first end and a second end opposing the first end. The first end of the optical bridge is interfaced with the facet of the active region. The second end of the optical bridge is interfaced with the end of waveguide, and has a portion thereof disposed over the step at the end of the waveguide.

DETAILED DESCRIPTION OF THE INVENTION

The present invention relates generally to an integrated photonic device and methods of making same. More specifically, the present invention relates to an integrated photonic device that includes a semiconductor wafer having a waveguide formed therein, a semiconductor chip bonded to the semiconductor wafer and having an active region, and a waveguide coupler for coupling the waveguide and the active region of the semiconductor chip.

Figure 1:
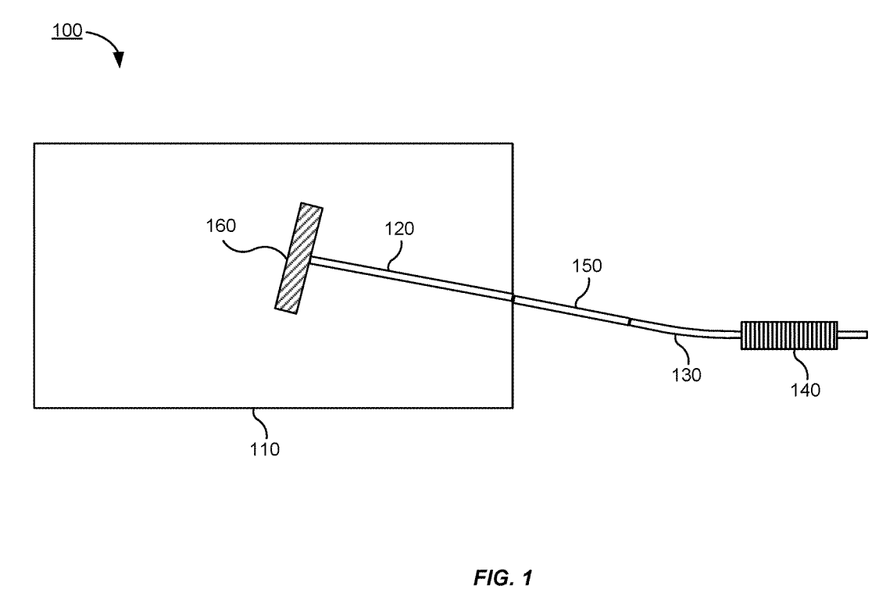
FIG. 1 shows a schematic plan view of a portion of a photonic device according to an embodiment of the present invention.

FIG. 1 shows a schematic plan view of a portion of an integrated photonic device 100 according to an embodiment of the present invention. The photonic device 100 includes a silicon photonic grating 140 and a waveguide 130, which are formed in a device layer of a silicon-on-insulator (SOI) wafer. The photonic device 100 further includes a semiconductor chip 110. In some embodiments, the semiconductor chip 110 comprises a III-V material and includes a back-side mirror 160 and a laser ridge 120 formed therein. The semiconductor chip 110 is bonded to the SOI wafer. A waveguide coupler 150 is formed on the SOI wafer to provide optical coupling between the waveguide 130 and the laser ridge 120.

FIGS. 2-10 show schematic cross-sectional views illustrating intermediate steps of a method of forming an integrated photonic device 200 according to embodiments of the present invention.

Figure 2:
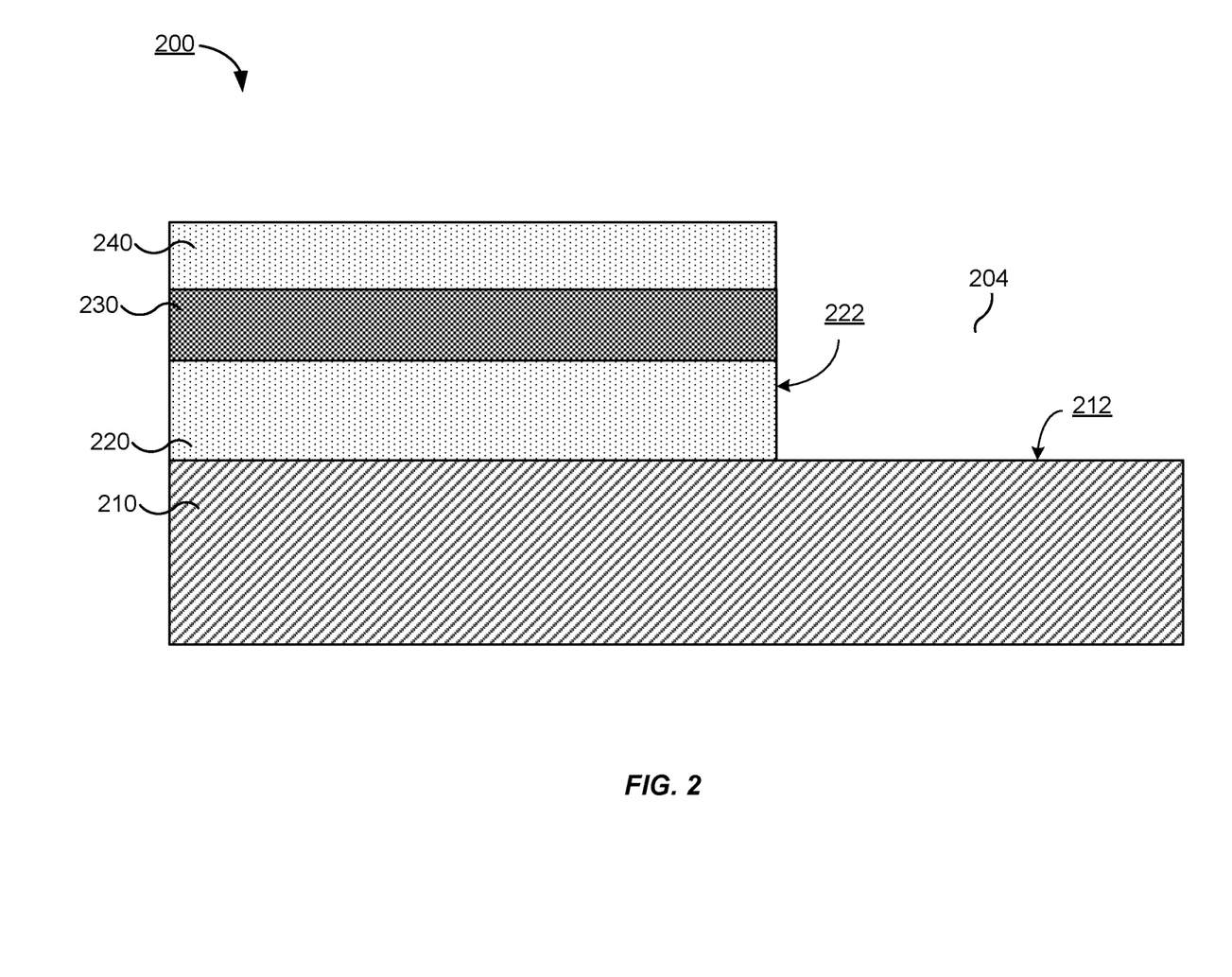
FIGS. 2-10 show schematic cross-sectional views illustrating the steps of a method of forming a photonic device according to embodiments of the present invention.

Referring to FIG. 2, a semiconductor wafer is provided. The semiconductor wafer includes a base layer 210, and a buried oxide (BOX) layer 220 disposed over a surface 212 of the base layer 210. In some embodiments, the base layer 210 comprises silicon, and the BOX layer 220 comprises silicon oxide. A waveguide 230 is formed in a device layer over the BOX layer 220. The waveguide 230 comprises crystalline silicon in an embodiment. Crystalline silicon has a higher refractive index compared to that of silicon oxide. Thus, the BOX layer 220 serves as a lower cladding layer for the waveguide. An upper cladding layer 240 is formed over the waveguide 240. The upper cladding layer 240 comprises silicon oxide in an embodiment. The upper and lower cladding layers provide traversal (vertical) optical confinement in the waveguide 240. The waveguide 240 may also be surrounded by a cladding material in the plane of the device layer for lateral optical confinement.

Still referring to FIG. 2, a recess 204 is formed on the semiconductor wafer. Walls in the semiconductor wafer define the recess 204. The recess 204 runs through the device layer and the BOX layer 220 to expose a portion of the surface 212 of the base layer 210. The recess 204 has a sidewall 222 that exposes an end of the waveguide 230. The sidewall 222 of the recess 204 is one of the walls defining the recess. The recess 204 may be formed by etching, using techniques such as dry etch, wet etch, chemically assisted ion beam etch, reactive ion etch, or the like. One of ordinary skill in the art would recognize many variations, alternatives, and modifications.

Figure 3:
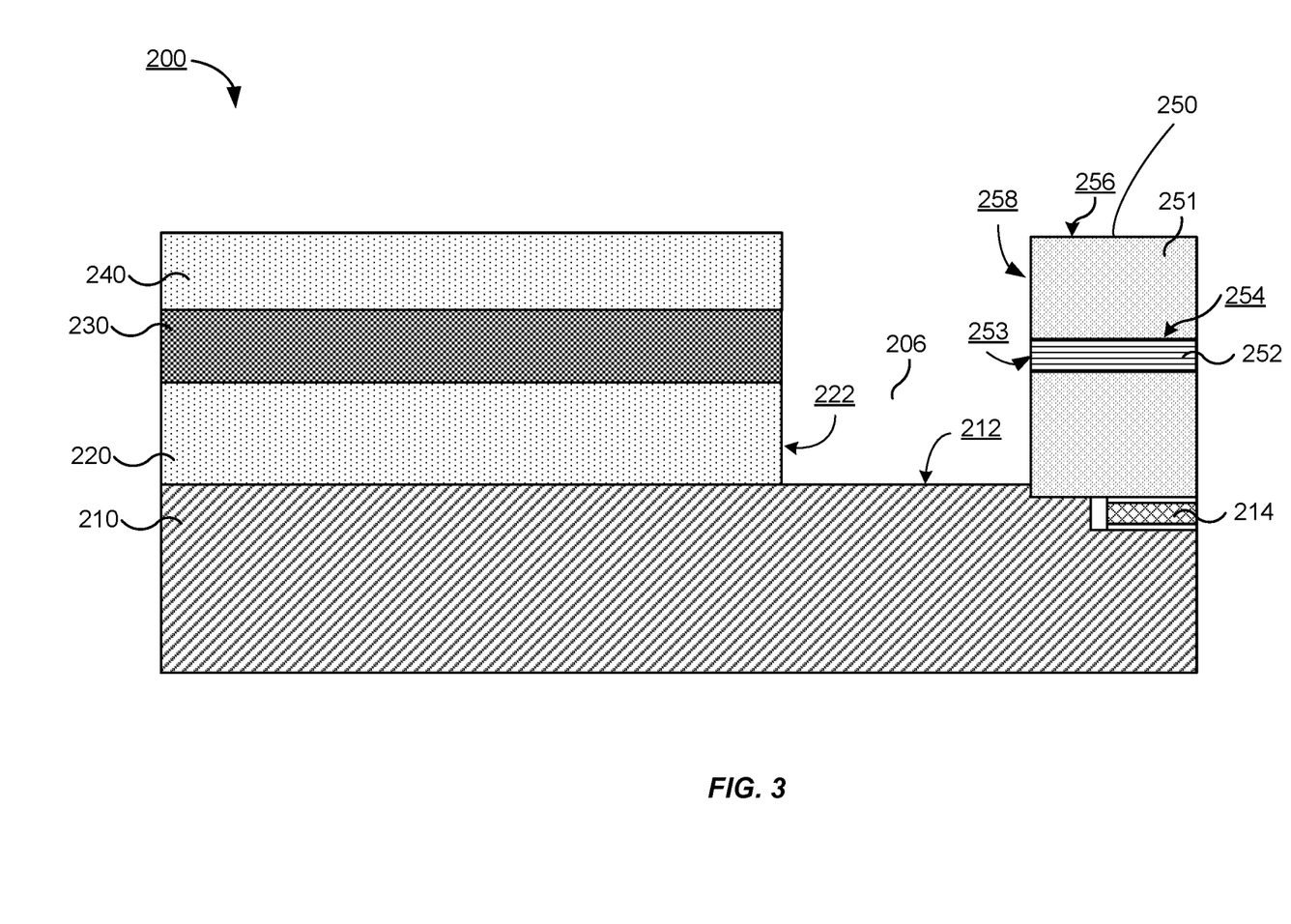

Referring to FIG. 3, a semiconductor chip 250 is bonded to the exposed portion of the surface 212 of the base layer 210 via a bonding structure 214. U.S. patent application Ser. No. 14/509,971 describes in more detail the process of bonding a semiconductor chip to a semiconductor wafer, the content of which is incorporated herein by reference in its entirety. There is a gap 206 between the sidewall 222 of the recess 204 and a sidewall 258 of the semiconductor chip 250. The size of the gap 206 may range from a few microns (e.g., 5 μm) to greater distances (e.g., 200 μm) according to various embodiments. In some embodiments, semiconductor chip 250 includes a substrate 251 that comprises InP, GaAs, InGaAs, InGaAsP, AlGaInAs, GaN, or the like. The semiconductor chip 250 also includes an active region 252 that comprises optically active materials that can produce optical gain, variable optical phase, optical attenuation, absorption, or the like. In some embodiments, the active region 252 comprises a multiple quantum well (MQW) structure. The active region 252 is aligned with the waveguide 230 along an optical path. An end facet 253 of the active region 252 is exposed at the sidewall 258 of the semiconductor chip 250.

In the following, the steps of forming a waveguide coupler between the waveguide 230 and the active region 252 is described with reference to FIGS. 4-10.

Figure 4:
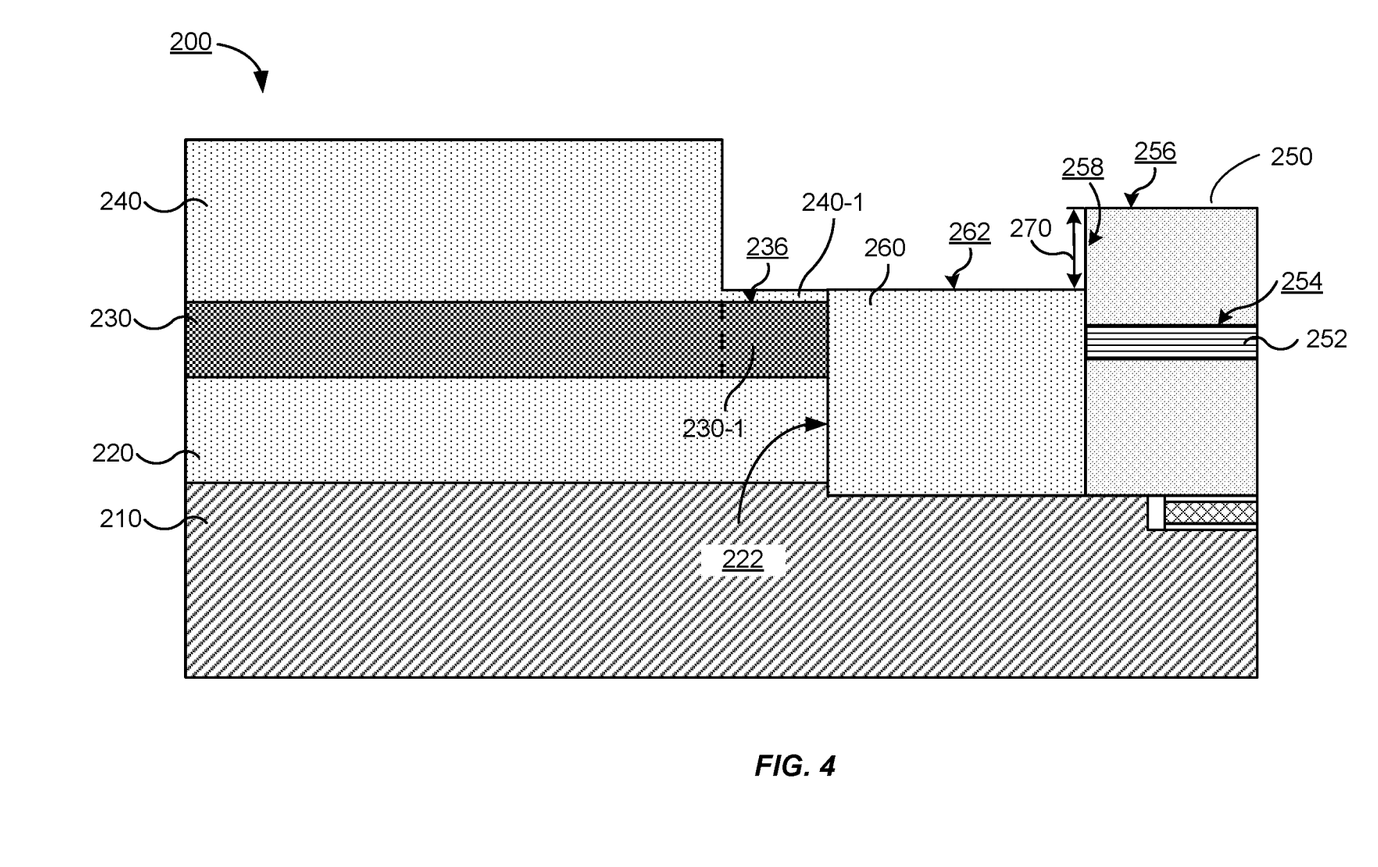

Referring to FIG. 4, an insulating layer 260 is formed in the gap 206 between the sidewall 222 of the recess 204 and the sidewall 258 of the semiconductor chip 250. The upper surface 262 of the insulating layer 260 is above the upper surface 254 of the active region 252 and the upper surface 236 of the waveguide 230, and below the upper surface 256 of the semiconductor chip 250 by a height difference 270. U.S. Pat. No. 9,097,846 describes a process of forming an insulating layer in the gap, the content of which is incorporated herein by reference in its entirety. In some embodiments, a portion of the upper cladding layer 240 located above an end of the waveguide 230-1 is removed, such that the remaining portion of the upper cladding layer 240-1 located above the end of the waveguide 230-1 is thinner than the rest of the upper cladding layer 240. According to various embodiments, the upper surface of the remaining portion of the upper cladding layer 240-1 located above the end of the waveguide 230-1 may or may not be flush with the upper surface 262 of the insulating layer 260.

The insulating layer 260 comprises silicon oxide in some embodiments. The insulating layer 260 may be formed by deposition (e.g., using techniques such as chemical vapor deposition (CVD), plasma enhanced CVD (PECVD), sputtering, sub-atmospheric CVD (SACVD), physical vapor deposition (PVD), evaporation, atomic layer deposition (ALD), a spin-on process, or the like). The insulating layer 260 may also be deposited above the end portion of the waveguide 230-1. In some embodiments, the insulating layer 260 may comprise other dielectric materials, such as $Si_3N_4$, $Si_xO_y$, $Si_xO_yN_z$, $Si_xN_y$, or the like. Depending on the mode profile in the waveguide 230 and the active region 252, the refractive index of the insulating layer 260 may be selected to provide a good cladding performance for a high coupling efficiency between the waveguide 230 and the active region 252 during the optical bridge formation process to be described below.

Figure 5:
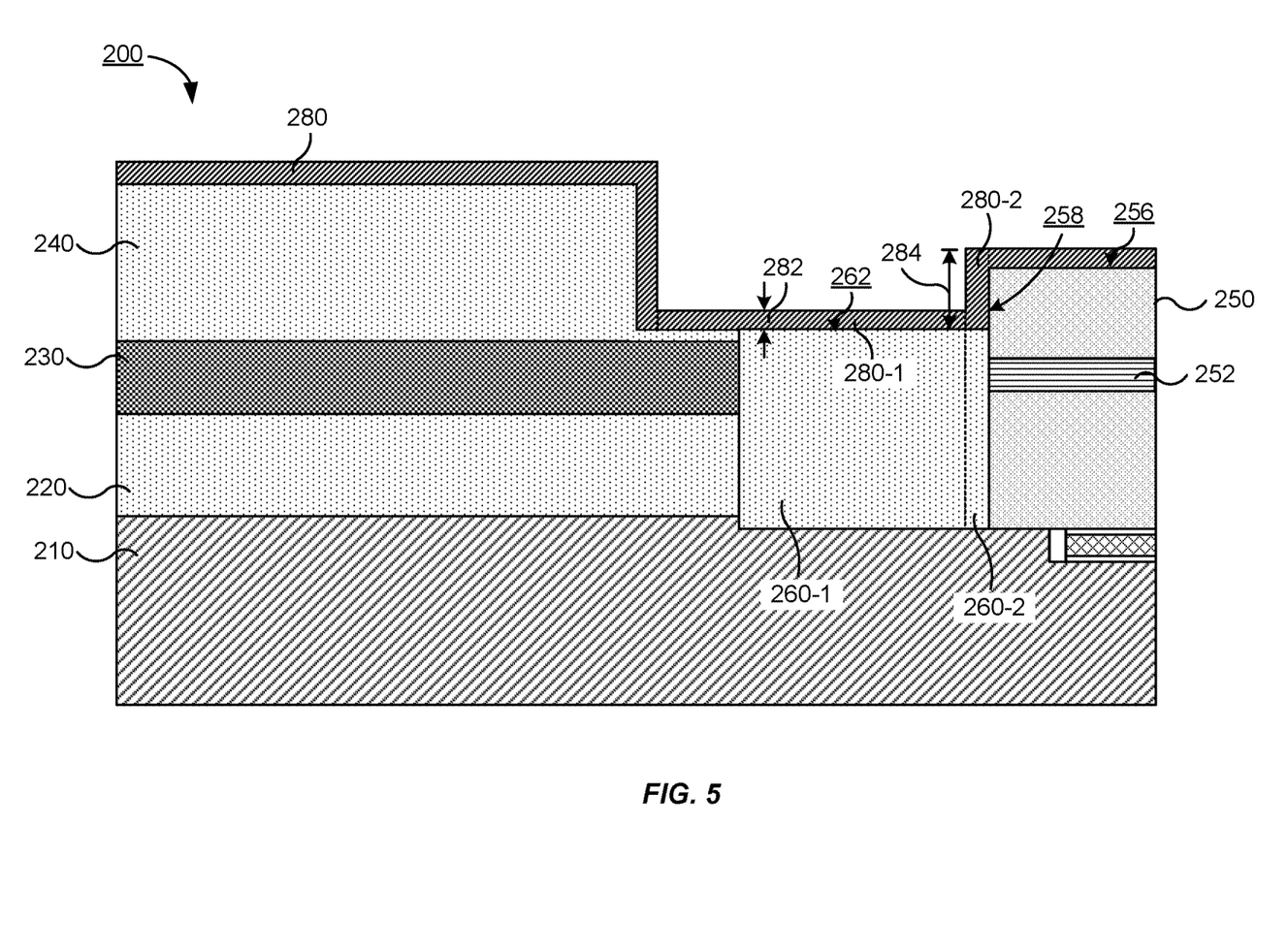

Referring to FIG. 5, a spacer layer 280 is formed (e.g., by deposition using CVD, PECVD, SACVD, PVD, evaporation, ALD, a spin-on process, or the like). The deposition of the spacer layer 280 is conformal so that the spacer layer 280 conforms to a topography of the surface of the photonic device, covering the upper surface of the upper cladding layer 240 (including the upper surface of the remaining portion of the upper cladding layer 240-1 located above the end of the waveguide 230-1), a sidewall of the upper cladding layer 240, the upper surface 262 of the insulating layer 260, the sidewall 258 of the semiconductor chip 250, and the upper surface 256 of the semiconductor chip 250. The material for the spacer layer 280 may be selected from silicon oxide, silicon nitride, aluminum oxide, hafnium oxide, or other suitable dielectric material. According to some embodiments, the spacer layer 280 comprises silicon oxide.

Still referring to FIG. 5, the spacer layer 280 includes a first section 280-1 and a second section 280-2. The first section of the spacer layer 280-1 is over a first section of the insulating layer 260-1 that abuts the sidewall 222 of the recess 206. The second section of the spacer layer 280-2 is over the second section of the insulating layer 260-2 that abuts the sidewall 258 of the semiconductor chip 250. The second section of the spacer layer 280-2 conforms to the sidewall 258 of the semiconductor chip 250, and has a height 284 that is approximately equal to the thickness 282 of the spacer layer 280 plus the height difference 270 between the upper surface 256 of the semiconductor chip 250 and the upper surface 262 of the insulating layer 260. Because the top portion of the sidewall 258 of the semiconductor chip 250 is exposed before the spacer layer 280 is formed, the second section of the spacer layer 280-2 is self-aligned against the sidewall 258 of the semiconductor chip 250. In some embodiments, the thickness 282 of the spacer layer 280 may range from 0.01 μm to 1 μm, and the height 284 of the second section of the spacer layer 280-2 may range from 0.2 µm to 4 µm. In some embodiments, the height 284 of the second section of the spacer layer 280-2 is typically much greater than the thickness 282 of the first section of the spacer layer 280-1 (e.g., the height 284 of the second section of the spacer layer 280-2 is more than double or triple the thickness 282 of the first section of the spacer layer 280-1).

Figure 6:
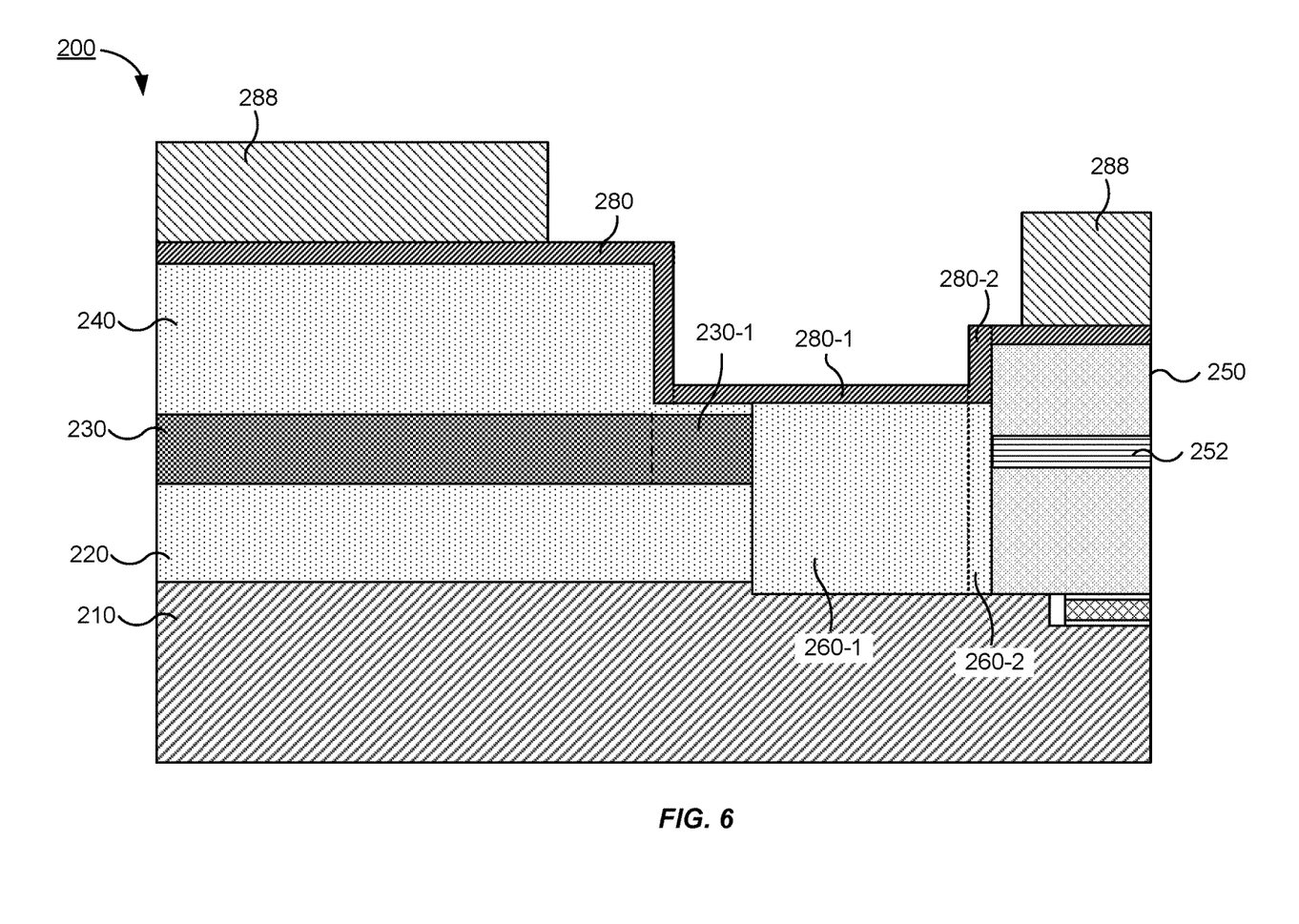

Referring to FIG. 6, a photoresist layer 288 is formed. A window in the photoresist layer 288 is created by using a mask to expose the area in the gap 206 between the sidewall 258 of the semiconductor chip 250 and the sidewall 222 of the recess 204. The window is sufficiently large so that the second section of the spacer layer 280-2 is exposed, as well as a portion of the spacer layer 280 above the end portion of the waveguide 230-1.

Figure 7:
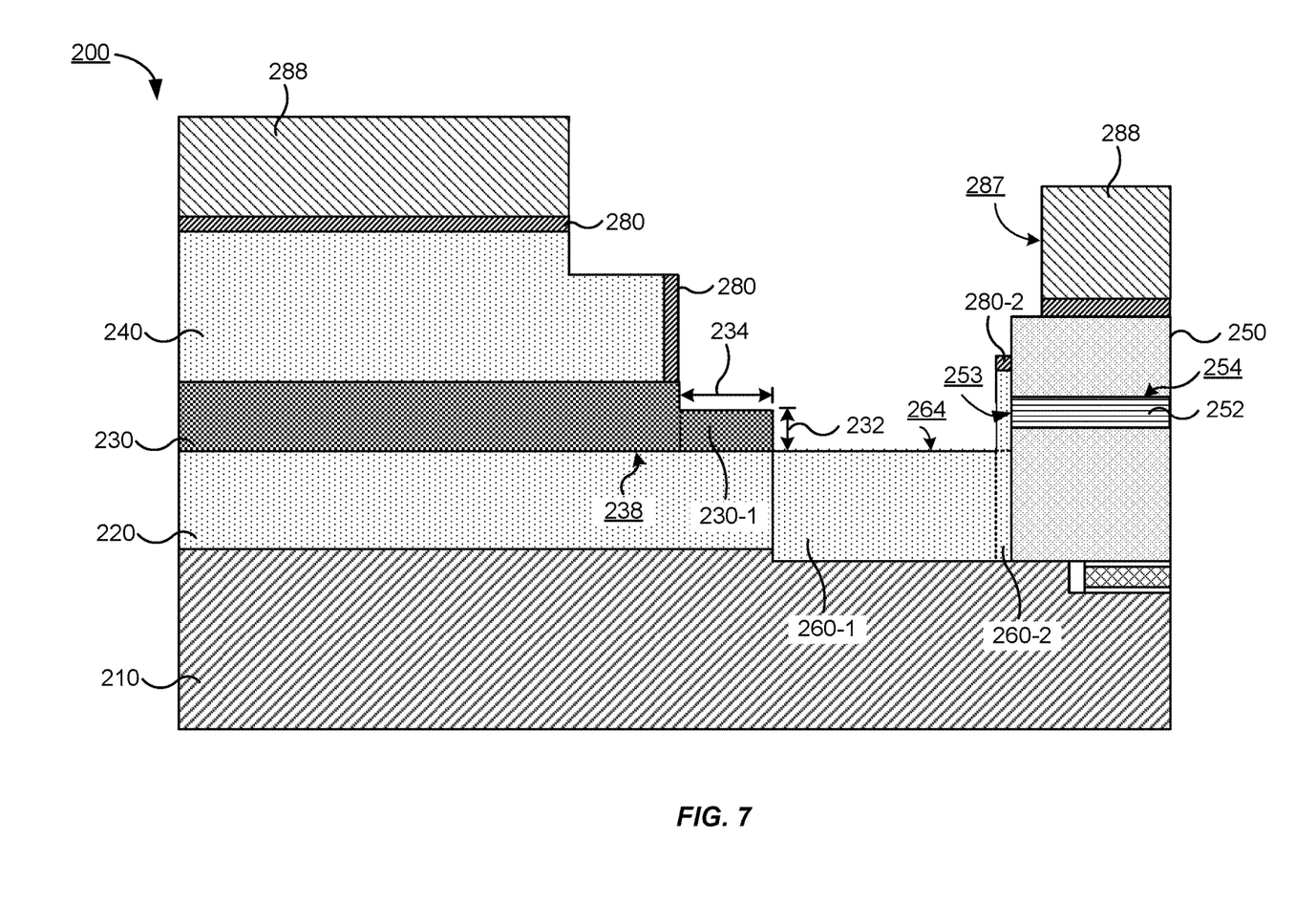

Referring to FIG. 7, a dry etch process step is performed. The etching removes the first section of the spacer layer 280-1. A portion of the first section of the insulating layer 260-1 is also removed, such that the upper surface 264 of the remaining first portion of the insulating layer 260-1 is slightly below, slightly above, or flush with the lower surface 238 of the waveguide 230, to facilitate the formation of an optical bridge to be described below. Because dry etching can be optimized to be a vertical process (i.e. anisotropic), and because the height 284 of the second section of the spacer layer 280-2 is much greater than the thickness 282 of the first section of the spacer layer 280-1, in some embodiments, only a portion of the second section of the spacer layer 280-2 is removed and the second section of the insulating layer 260-2 is not removed. In addition, the etching also removes a portion of the spacer layer 280 disposed on the upper cladding layer 240, and a portion of the upper cladding layer 240. In some embodiments, the spacer layer 280 comprises a different material than that of the insulating layer 260, and has a lower etch rate than that of the insulating layer 260. In that case, the difference between the height 284 of the second section of the spacer layer 280-2 and the thickness 282 of the first section of the spacer layer 280-1 may not need to be as large. According to another embodiment, the spacer layer 280 comprises silicon oxide having a density higher than that of the silicon oxide in the second insulating layer 260, and thus has a lower etch rate that of the second insulating layer 260.

The second section of the insulating layer 260-2 serves as a self-aligned protective layer that covers the facet 253 of the active region 252, and therefore prevents damages to the active region 252 from mechanical and chemical attack during the etch and during subsequent processes such as photoresist stripping and wafer cleaning, and the like. It is understood that, even if all of the second section of the spacer layer 280-2 and a portion of the second section of the insulating layer 260-2 are etched away, as long as the remaining portion of the second section of the insulating layer 260-2 is higher than the upper surface 254 of the active region 252, the active region 252 would be protected. By using the spacer layer 280 to create a self-aligned thin protective layer in front of the active region 252, it is not necessary to align the window of the photoresist layer 288 precisely. Therefore, in this method, as long as the window of the photoresist layer 288 is dimensioned such that an edge 287 of the window is located somewhere above the semiconductor chip 250 so that the second section of the spacer layer 280-2 is exposed, the etching process will create the thin protective layer in front of the facet 253 of the active region 252.

Still referring to FIG. 7, in the etching process, a portion of the end of the waveguide 230-1 is also removed. Because the etch process can be optimized in such a way that the etch-rate of silicon oxide in the second insulating layer 260 is greater than that of crystalline silicon in the waveguide 230, not the entire end of the waveguide 230-1 is removed. Thus, the remaining portion of the end of the waveguide 230-1 forms a step having a height 232 and a length 234. The step height 232 may be controlled by selecting an appropriate etch ratio between the two materials. For example, an etch ratio of 1:20, 1:10, 1:3, 1:2, or the like, may be selected. According to some embodiments, an etch ratio of approximately 1:2 is selected, such that the height 232 of the step 230-1 is approximately one half of the height of the waveguide 230.

Figure 8:
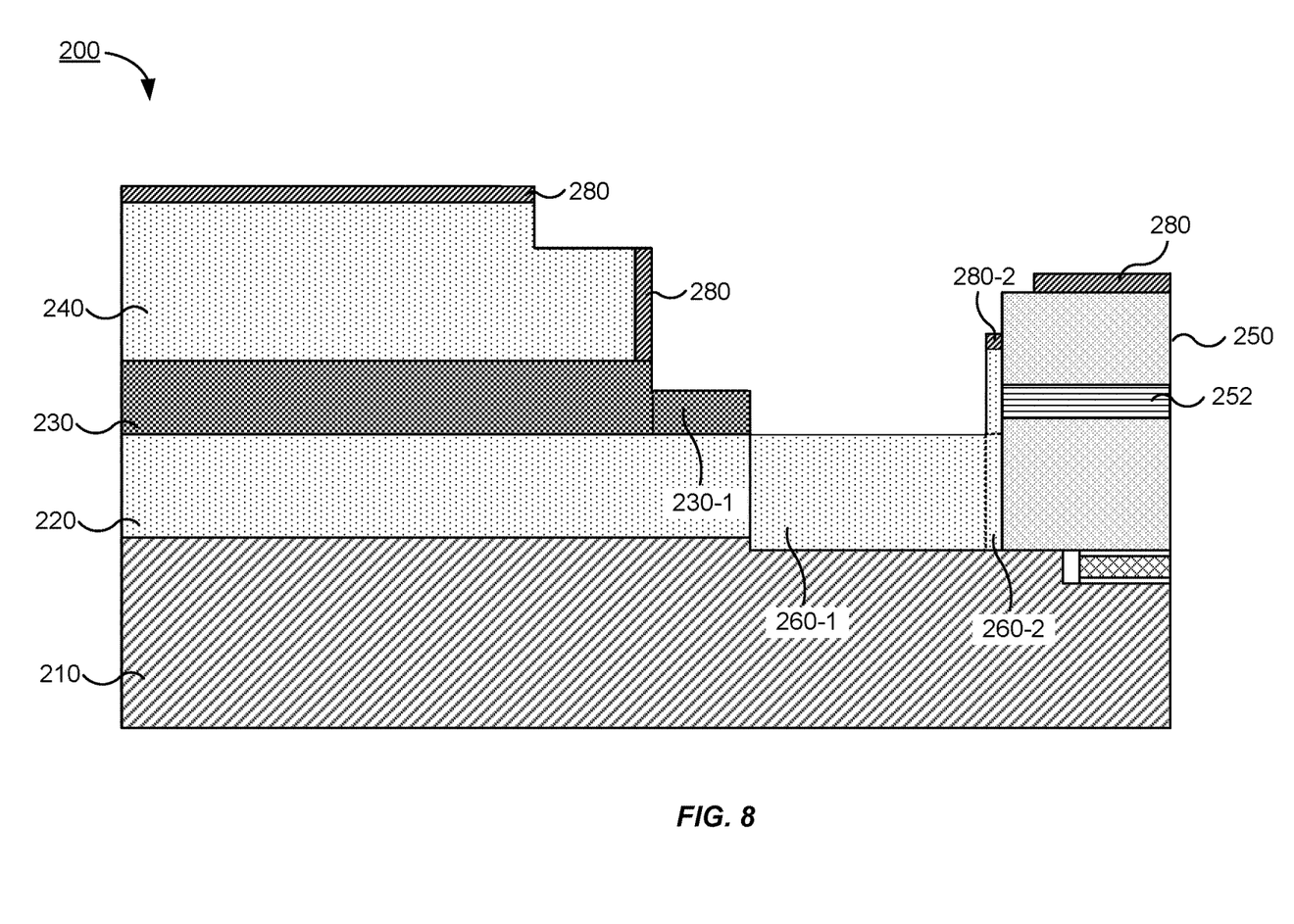

Referring to FIG. 8, the photoresist layer 280 is removed.

Figure 9:
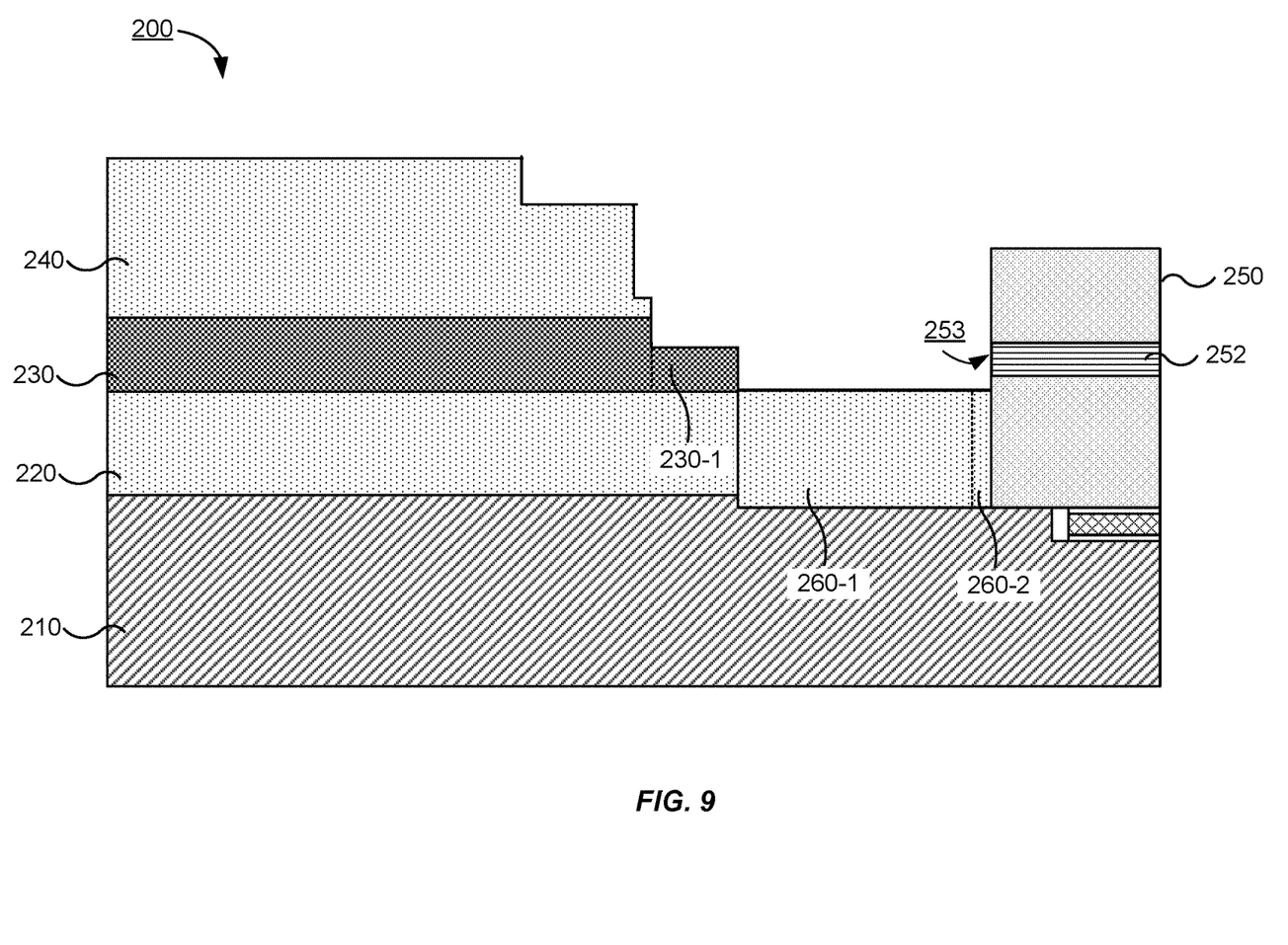

Referring to FIG. 9, a portion of the second section of the spacer layer 260-2 is removed so that the upper surface of the remaining portion of the second section of the insulating layer 260-2 is flush with the upper surface of the remaining portion of the first section of the insulating layer 260-1. The facet 253 of the active region 252 is exposed for the formation of an optical bridge as described below.

Figure 10:
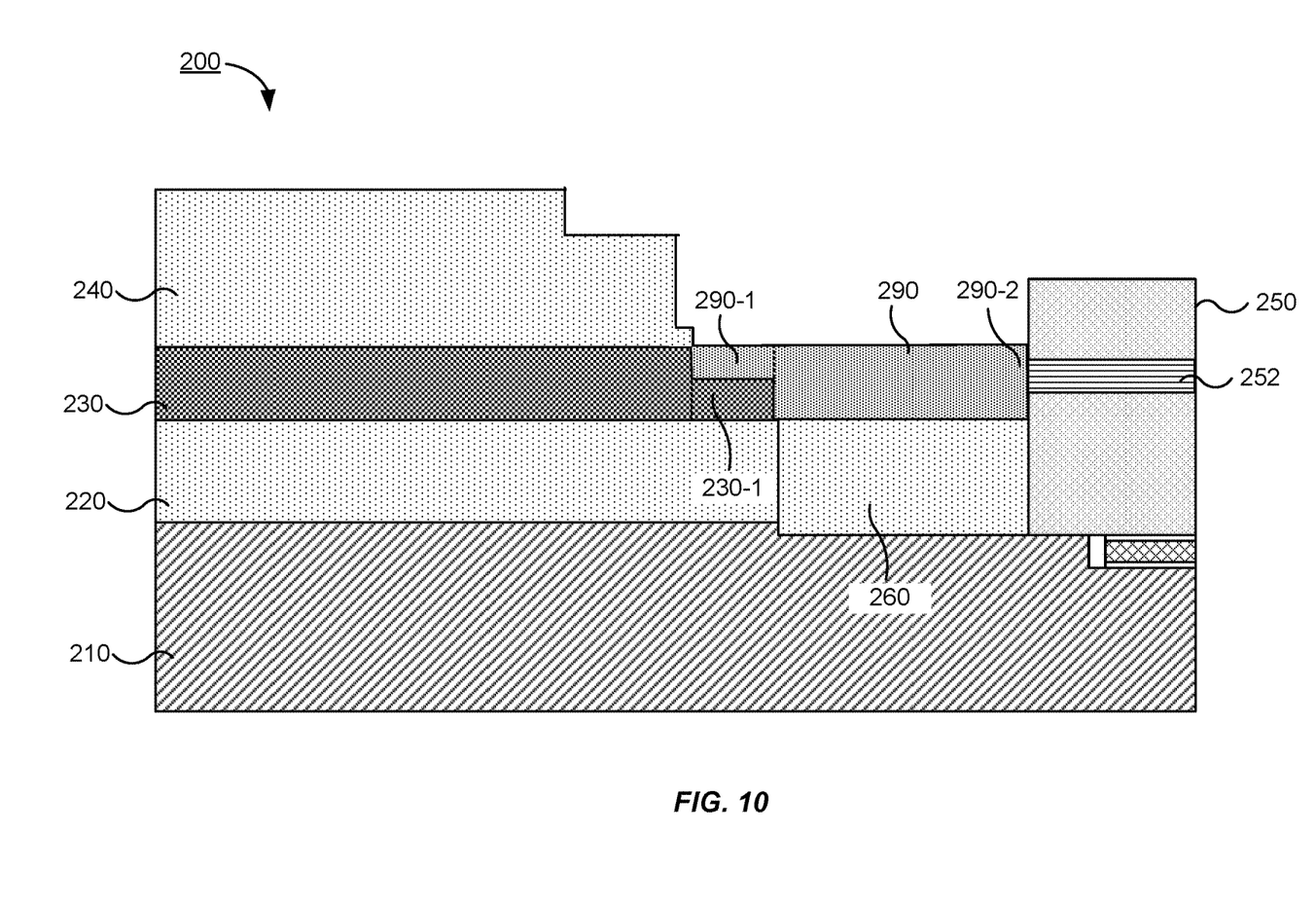

Referring to FIG. 10, an optical bridge 290 is formed over the second insulating layer 260. U.S. Pat. No. 9,097,846 describes a process of forming an optical bridge, the content of which is incorporated herein by reference in its entirety. The optical bridge 290 provides optical coupling between the waveguide 230 and the active region 252 of the semiconductor chip 250. The optical bridge 290 comprises a material with a refractive index higher than that of silicon oxide in the insulating layer 260 to provide optical confinement in the optical bridge 290. According to some embodiments, the optical bridge 290 comprises amorphous silicon (a-Si). The optical bridge 290 may be formed by deposition using any appropriate deposition technique.

Still referring to FIG. 10, the first end of the optical bridge 290-2 mates with the active region 252 at the sidewall 258 of the semiconductor chip 250. A portion of the second end of the optical bridge 290-1 is disposed on the step at the end of the waveguide 230-1, such that the optical bridge 290 has an L-shaped cross-section at the interface. According to some embodiments, the height of the step 230-1 ranges from about 5% to about 95% of the thickness of the waveguide 230. In some other embodiments, the height of the step 230-1 ranges from about 10% to about 85%, or from about 20% to about 75%, or from about 30% to about 65%, or from about 40% to about 55%, of the thickness of the waveguide 230. The length of the interface region may be selected by selecting an appropriate length 234 of the step 230-1. In some embodiments, the length of the interface region ranges from about 0.1 µm to about 50 µm. In some other embodiments, the length of the interface region ranges from about 0.5 µm to about 50 µm, or from about 1 µm to about 50 µm, or from about 5 µm to about 50 µm. In one embodiment, the height of the step 230-1 is approximately one-half of the thickness of the waveguide 230. Thus, the effective refractive index in the interface region is approximately an average of the refractive index of the optical bridge and that of the waveguide 230. In other embodiments, the ratio of the height of the step 230-1 to the thickness of the waveguide 230, as well as the length 234 of the step 230-1, may be designed to have other values as needed to optimize the effective refractive index of the interface region to enable optimized optical coupling between the waveguide 230 and the active region 252.

According to an embodiment of the present invention, a method of forming a photonic device includes providing a semiconductor wafer 202. The semiconductor wafer includes a base layer 210 and a first insulating layer 220. The method further includes forming a waveguide 230 over the first insulating layer 220; performing etching to form a recess 204 in the semiconductor wafer 202; and bonding a semiconductor chip 250 to the semiconductor wafer 202 in the recess 204. The semiconductor chip 250 includes an active region 252. The method further includes forming a second insulating layer 260 in a gap 206 between a sidewall 258 of the semiconductor chip 250 and a sidewall 222 of the recess 204; and forming a spacer layer 280. The spacer layer 280 includes a first section 280-1 disposed over a first section 260-1 of the second insulating layer 260 that abuts the sidewall 222 of the recess 204, and a second section 280-2 disposed over a second section 260-2 of the insulating layer 260 that abuts the sidewall 258 of the semiconductor chip 250. The method further includes performing an etch to remove the first section 280-1 of the spacer layer 280 and a portion of the first section 260-1 of the insulating layer 260 to expose the end of the waveguide 230 without exposing the active region 252 of the semiconductor chip 250.

In some embodiments, the base layer of the semiconductor wafer may include silicon. The first insulating layer and the second insulating layer may include silicon oxide. The waveguide may include crystalline silicon. The semiconductor chip may include a III-V material. The active region may include a multiple-quantum-well (MQW) structure. The spacer layer may include a dielectric material. In some embodiments, the dielectric material is selected from one of silicon oxide, silicon nitride, aluminum oxide, hafnium oxide, or a combination thereof. In some embodiments, the spacer layer is formed by chemical vapor deposition (CVD), plasma enhanced CVD (PECVD), sputtering, sub-atmospheric CVD (SACVD), physical vapor deposition (PVD), evaporation, or atomic layer deposition (ALD). In an embodiment, the second height of the second section of the spacer layer is substantially equal to a sum of the first height and the thickness of the first section of the spacer layer.

In some embodiments, the method may further include, forming a third insulating layer over the waveguide before forming the spacer layer. A portion of the spacer layer is disposed over the third insulating layer. In some embodiments, the base layer of the semiconductor wafer includes silicon; the waveguide includes crystalline silicon; and the first insulating layer, the second insulating layer, and the third insulating layer includes silicon oxide.

In some embodiments, the method further includes removing a portion of the second section of the second insulating layer to expose the active region after the first section of the spacer layer and the portion of the first section of the second insulating layer are removed. The portion of the second section of the second insulating layer is removed by one of dry etch, wet etch, chemically assisted ion beam etch, or reactive ion etch.

In some embodiments, the spacer layer is a thin film deposited conformally on the semiconductor wafer. The spacer layer may provide a property for selecting etch with respect to the second insulating layer. The spacer layer may also provide a property for ease of removal.

Figure 11:
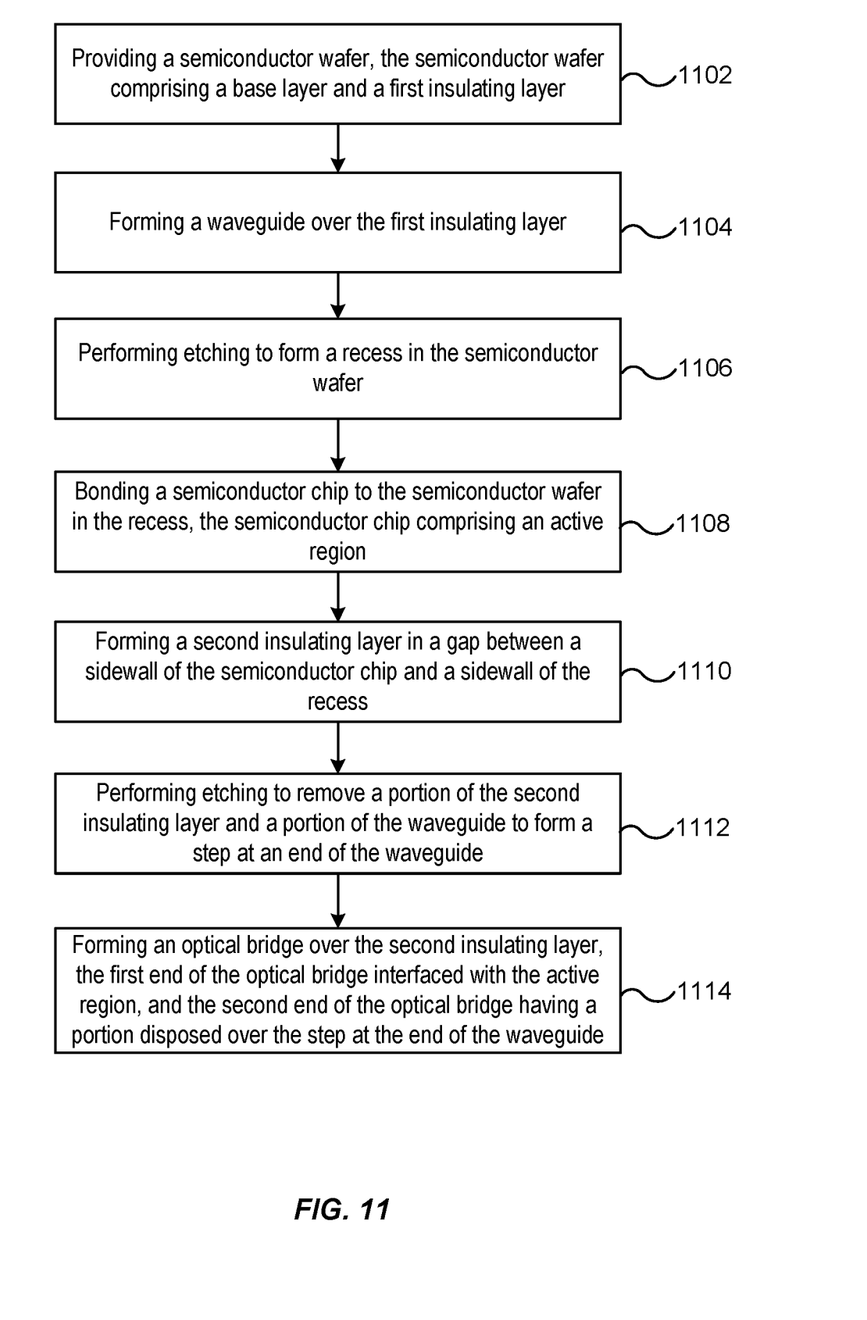
FIG. 11 shows a simplified flowchart illustrating a method of forming a photonic device according to an embodiment of the present invention.

FIG. 11 shows a simplified flowchart illustrating a method of forming a photonic device according to another embodiment of the present invention. The method includes, at 1102, providing a semiconductor wafer 202. The semiconductor wafer includes a base layer 210 and a first insulating layer 220. The method further includes, at 1104, forming a waveguide 230 over the first insulating layer 220; at 1106, performing etching to form a recess 204 in the semiconductor wafer 202; and at 1108, bonding a semiconductor chip 250 to the semiconductor wafer 202 in the recess 204. The semiconductor chip 250 includes an active region 252. The method further includes, at 1110, forming a second insulating layer 260 in a gap 206 between a sidewall 258 of the semiconductor chip 250 and a sidewall 222 of the recess 204; and at 1112, performing etching to remove a portion of the second insulating layer 260 to expose an end of the waveguide 230-1, and to remove a portion of the end of the waveguide 230-1, thereby forming a step 230-1 at the end of the waveguide 230. The method further includes, at 1114, forming an optical bridge 290 over the second insulating layer 260. A first end of the optical bridge 290 is interfaced with the active region 252 of the semiconductor chip 250. A second end of the optical bridge 290 has a portion 290-1 that is disposed over the step 230-1 at the end of the waveguide 230.

It should be appreciated that the specific steps illustrated in FIG. 11 provide a particular method of forming a photonic device according to an embodiment of the present invention. Other sequences of steps may also be performed according to alternative embodiments. For example, alternative embodiments of the present invention may perform the steps outlined above in a different order. Moreover, the individual steps illustrated in FIG. 11 may include multiple sub-steps that may be performed in various sequences as appropriate to the individual step. Furthermore, additional steps may be added and some steps may be removed depending on the particular applications. One of ordinary skill in the art would recognize many variations, modifications, and alternatives.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to explain the principles of the invention and its practical applications to thereby enable others skilled in the art to utilize the invention in various embodiments and with various modifications as are suited to the particular use contemplated.

What is claimed is:

1. A photonic device comprising:
   a semiconductor wafer comprising:
      a base layer;
      a first insulating layer disposed over a surface of the base layer;
      a device layer disposed over the first insulating layer; and
      a waveguide formed in the device layer;
      wherein the semiconductor wafer comprises walls defining a recess in the device layer and the first insulating layer, the recess exposing a portion of the surface of the base layer and an end of the waveguide; and
      wherein the end of the waveguide comprises a first step having a first length and a first height, the first height being less than a thickness of the waveguide;
   a semiconductor chip bonded to the surface of the base layer of the semiconductor wafer, wherein:
      the semiconductor chip comprises an active region;
      a facet of the active region is exposed at a sidewall of the semiconductor chip; and there is a gap between the sidewall of the semiconductor chip and one of the walls of the semiconductor wafer defining the recess; and a waveguide coupler disposed in the gap, the waveguide coupler comprising:
  a second insulating layer disposed over the surface of the base layer of the semiconductor wafer; and
  an optical bridge disposed over the second insulating layer, wherein:
    the optical bridge has a first end and a second end opposing the first end;
    the first end of the optical bridge is interfaced with the facet of the active region; and
    the second end of the optical bridge has a second step having a second length and a second height, the second height being less than a thickness of the optical bridge, and the second step is disposed over the first step of the waveguide.

2. The photonic device of claim 1, wherein the first height of the first step ranges from about 5% to about 95% of the thickness of the waveguide.

3. The photonic device of claim 2, wherein the first height of the first step ranges from about 10% to about 85%, or from about 20% to about 75%, or from about 30% to about 65%, or from about 40% to about 55%, of the thickness of the waveguide.

4. The photonic device of claim 1, wherein the first length of the first step ranges from about 0.1 µm to about 50 µm.

5. The photonic device of claim 4, wherein the first length of the first step ranges from about 0.5 µm to about 50 µm, or from about 1 µm to about 50 µm, or from about 5 µm to about 50 µm.

6. The photonic device of claim 1, wherein the base layer of the semiconductor wafer comprises silicon.

7. The photonic device of claim 6, wherein the semiconductor chip comprises a III-V material.

8. The photonic device of claim 7, wherein the active region comprises a multiple-quantum-well (MQW) structure.

9. The photonic device of claim 1, further comprising:
  a third insulating layer disposed over the waveguide.

10. The photonic device of claim 9, wherein:
  the base layer of the semiconductor wafer comprises silicon;
  the waveguide comprises crystalline silicon; and
  the first insulating layer, the second insulating layer, and the third insulating layer comprise silicon oxide.

11. The photonic device of claim 10, wherein the optical bridge comprises amorphous silicon.

12. The photonic device of claim 1, wherein the waveguide has a first refractive index, and the optical bridge has a second refractive index different from the first refractive index.

13. A method for fabricating a photonic device, the method comprising:
  providing a semiconductor wafer, the semiconductor wafer comprising:
    a base layer;
    a first insulating layer disposed over a surface of the base layer;
    a device layer disposed over the first insulating layer; and
    a waveguide formed in the device layer;
  performing etching to form a recess in the device layer and the first insulating layer, wherein:
    the recess exposes a portion of the surface of the base layer; and
    the recess has a sidewall exposing an end of the waveguide;
  bonding a semiconductor chip to the exposed portion of the surface of the base layer, wherein:
    the semiconductor chip comprises an active region;
    a facet of the active region is exposed at a sidewall of the semiconductor chip; and
    there is a gap between the sidewall of the semiconductor chip and the sidewall of the recess;
  forming a second insulating layer in the gap;
  performing etching to remove a portion of the waveguide to form a first step at the end of the waveguide; and
  forming an optical bridge over the second insulating layer, wherein:
    the optical bridge has a first end and a second end opposing the first end;
    the first end of the optical bridge is interfaced with the facet of the active region; and
    the second end of the optical bridge has a second step disposed over the first step at the end of the waveguide.

14. The method of claim 13, wherein the first step has a height ranging from about 5% to about 95% of the thickness of the waveguide.

15. The method of claim 14, wherein the first step has a height ranging from about 10% to about 85%, or from about 20% to about 75%, or from about 30% to about 65%, or from about 40% to about 55%, of the thickness of the waveguide.

16. The method of claim 13, wherein the first step has a length ranging from about 0.1 µm to about 50 µm.

17. The method of claim 16, wherein the first step has a length ranging from about 0.5 µm to about 50 µm, or from about 1 µm to about 50 µm, or from about 5 µm to about 50 µm.

18. The method of claim 13, wherein the base layer of the semiconductor wafer comprises silicon.

19. The method of claim 18, wherein the semiconductor chip comprises a III-V material.

20. The method of claim 19, wherein the active region comprises a multiple-quantum-well (MQW) structure.

* * * * *